(12) United States Patent
Johansson et al.

(10) Patent No.: US 6,459,140 B1
(45) Date of Patent: Oct. 1, 2002

(54) INDIUM-ENHANCED BIPOLAR TRANSISTOR

(75) Inventors: Ted Johansson, Djursholm; Hans Norström, Solna, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 13 days.

(21) Appl. No.: 09/680,321

(22) Filed: Oct. 6, 2000

(30) Foreign Application Priority Data

Oct. 8, 1999 (SE) ................................................ 9903629

(51) Int. Cl.$^7$ ........................................... H01L 27/082
(52) U.S. Cl. ........................ 257/592; 257/917; 438/373; 438/374; 438/375
(58) Field of Search ................................ 257/592, 917; 438/373, 374, 375

(56) References Cited

U.S. PATENT DOCUMENTS

| | | | | |
|---|---|---|---|---|
| 5,126,278 A | * | 6/1992 | Kodaira | 257/197 |
| 5,681,763 A | | 10/1997 | Ham et al. | 438/309 |
| 6,087,683 A | * | 7/2000 | King et al. | 257/183 |
| 6,239,477 B1 | * | 5/2001 | Johnson | 257/592 |
| 6,344,678 B1 | * | 2/2002 | Yamamoto et al. | 257/587 |

OTHER PUBLICATIONS

Prinz et al., A Novel Double–Base Heterojunction Bipolar Transistor for Low–Temperature Bipolar Logic, IEEE Trans. Elec. Devices, 39 (Nov. 1992) 2636.*

Sato et al., A 60–GHz $f_T$ Super Self–Aligned Selectively Grown SiGe–Base (SSSB) Bipolar Transistor with Trench Isolation Fabricated on SOI Substrate and its Application to 20–Gb/s Optical Transmitter IC's, IEEE Trans. Elec. Devices, 46 (Jul. 1999) 1332.*

King et al., Very Low Cost Graded SiGe Base Bipolar Transistors for a High Performance Modular BiCMOS Process, IEDM Tech. Digest, Dec. 1999, 565.*

S. M. Sze, Physics of Semicondutor Devices, 2nd ed., pp. 25–26, Wiley, 1981.

I. C. Kizilyalli, A. S. Chen, W. J. Nagy, T. L. Rich, T. E. Ham, K. H. Lee, M S. Carroll, M Iannuzzi, "Silicon NPN Bipolar Transistors with Indium–Implanted Base Regions", IEEE Electron Device Letters, vol. 18, p. 120, Mar. 1997.

H. Tian, J. Hayden, B. Taylor, L. Wu, L. Zeng, "Characteristics of Indium Implanted Base npn Bipolar Transistors", IEEE Proc. BCTM, p. 156, 1998.

C. Y. Chang and S. M. Sze (eds.), "ULSI Technology", pp. 495–502 McGraw–Hill, 1996.

S. Jouan et al, "A High–Speed low 1/f Noise SiGe HBT Technology Using Epitaxially–Aligned Polysilicon Emitters", IEEE TED–46, p. 1525 (Jul., 1999).

* cited by examiner

*Primary Examiner*—Richard Elms
*Assistant Examiner*—Christian D. Wilson
(74) *Attorney, Agent, or Firm*—Burns, Doane, Swecker & Mathis, L.L.P.

(57) ABSTRACT

A method to improve the characteristics of bipolar silicon high-frequency transistor by adding indium into the base of the transistor is described. Instead of replacing boron in the base with indium to improve the beta-Early voltage product, at the price of high beta and high base resistance, separate boron and indium doping profiles are combined in the base. Thus, a transistor, which preserves most of the properties of pure boron-base transistor, is obtained, but with some parameters improved due to the added indium profile. This "double-profile" or "indium-enhanced" transistor exhibits improved beta-Early voltage product, reduced collector-base capacitance swing and lower temperature dependence of beta, but preserves the advantageous properties of a pure boron-base transistor. For this to work satisfactory, the indium profile must be contained within the boron profile in such a way that the beta and the effective base width are not significantly affected, otherwise the high frequency properties will be degraded. A typical process for fabricating a bipolar silicon high frequency NPN transistor together with some recorded parameters highlighting the benefits of an additional indium implant is presented.

18 Claims, 5 Drawing Sheets

INDIUM-ENHANCED BIPOLAR TRANSISTOR

TECHNICAL FIELD

This application claims priority under 35 U.S.C. §§ 119 and/or 365 to 9903629-5 filed in Sweden on Oct. 8, 1999; the entire content of which is hereby incorporated by reference.

The present invention relates to silicon bipolar transistors, especially low-voltage high-frequency transistors for use in mobile telecommunications.

Integrated circuits using bipolar transistors play a major role for modern telecommunication systems. The circuits are mostly used for analog functions, e.g. for switching currents and voltages, and for high-frequency radio functions (mixers, amplifiers, detectors etc.). For mobile telecommunication applications (e.g. handsets), the circuits are operated at low supply voltage (<3.5 V) to conserve energy and enable battery operation.

To achieve good high-frequency properties of the transistors, the base must be made very narrow. Several problems from the physics as well as the practical point of view arise. The doping of the base must be carefully tuned to give reasonable beta (current gain), not too high doping in the emitter-base junctions (low $BV_{ebo}$ will follow otherwise), enough doping to withstand voltage applied over the base without going into punch-through breakdown, the Early voltage should be high, base resistance should be low, etc.

The base is usually formed by ion implantation of boron. For a thin base, the preferred shape of the doping is a box, but with ion implantation, a smooth, almost half-triangular shape is usually obtained. A more advanced approach to the profile problem is to epitaxially deposit an in-situ doped base layer, thus obtaining a box profile structure. However, this will only improve some of the above-mentioned parameters.

Epitaxial-base transistors can be further improved by using Si1-xGex (0<x<0.2 typically) as material in the base. The SiGe-base transistor is an heterojunction bipolar transistor (HBT). The difference in band-gap between SiGe and Si is used to further reduce the base width, while maintaining a reasonable beta and base resistance, in order to increase the high-frequency properties of the transistor. The SiGe-base transistor may also have increased beta-Early voltage product (hFE.VA) as well as reduced temperature dependence of hFE.

Indium has a reasonably low diffusion coefficient and implant characteristics suitable for obtaining narrow doping layers. Indium is a p-dopant and could possibly be used as a replacement for boron in the base of the bipolar transistor. The most interesting difference compared to boron is the property of indium as "non-shallow" acceptor. At typical transistor operating temperatures, only a fraction of the indium acceptor states are ionized or active (referred to as "impurity freeze-out" [1]). As a result, the effective Gummel number is reduced and current gain is increased.

Another interesting aspect is that indium-base bipolar transistors should be less susceptible to the base-width modulation (i.e. Early effect) being caused by the reverse-biased collector-base junction (normal state of operation), because indium acceptor states falling within the collector-base depletion region will ionize and prevent the quasi-neutral base from being depleted by the reverse-biased junction. This should also reduce the voltage-dependent capacitance variation of the base-collector junction, which contributes to the non-linearities in the high-frequency transfer characteristics.

All bipolar silicon transistors exhibits a fairly high positive temperature coefficient for beta, i.e. beta increases with temperature. This temperature dependence leads to many difficulties and tradeoffs in circuit design. Furthermore, for bipolar power devices, the positive sign of the coefficient leads to thermal instability problems which is usually solved using ballasting emitter resistors, but at the expense of reduced performance and increased costs. Bipolar transistor that use indium in the base will have a reduced temperature dependence of beta, since at high temperatures more acceptor states will be ionized, thus increasing the effective base doping. This will reduce an increase in beta with temperature.

In U.S. Pat. No. 5,681,763 by Ham and Kizilyalli, a method to make bipolar transistors with an indium-doped base is described. In the patent, boron and indium dopings for the base are discussed in details (mainly for the purpose of improving the Early voltage of the transistor), but the effect of combining the two species is never discussed, although mentioned in the process flow in the text and the first claim, that when doping the base with indium, it may also be desirable to dope the base with boron.

The indicated range of indium dose ($1.10^{12}$–$1.10^{15}$ cm$^{-2}$) in the cited patent is too wide. At high doping level, the indium, which is a deep level impurity, will create a base recombination current, which will lead to leaky transistors and low low-current beta. The dose range instead have to be kept below $1.10^{14}$ cm$^{-2}$ to suppress this effect. At high levels of indium a transient enhanced diffusion (TED) of both boron and indium will occur completely destroying any advantages.

Bipolar transistors with indium-implanted base were experimentally verified [2, 3] using 0.5 µm and 0.25 µm BiCMOS technologies. The most important improvement was the increased Early voltage, and thus the improved beta-Early voltage product (hFE.VA product). The beta and base resistance however was increased more than ten times. This makes it more or less impossible to use the suggested device in any realistic radio circuit design.

In high-frequency bipolar transistors for use in telecommunication, a factor beta in the range 50–150 is preferred. In [2], an increase in beta from 120 to 1600 was obtained, and in [3] an increase from 120 to 1300 was obtained. To obtain a lower beta, very high indium concentration is needed and will lead to severe recombination of minority carriers in the base.

Low base resistance (RB) is a very important parameter. It affects fmax ($\propto 1/\sqrt{R_B}$), which is an important high-frequency parameter, and the noise in the device ($\propto \sqrt{R_B}$). In [2], the base resistance increased up to 21 times and in [3] 14 times compared to similar boron-base transistors.

Therefore there is still a demand for a method to improve the characteristics of bipolar silicon high-frequency transistors for improving the beta-Early voltage but without obtaining too high beta and/or too high base resistance.

SUMMARY

The present disclosure describes a method to improve the characteristics of bipolar silicon high-frequency transistor by adding indium into the base of the transistor. Only replacing the boron in the base with indium improves the beta-Early voltage product, but at the price of high beta and high base resistance.

}

Instead, it is here suggested to combine boron and indium doping profiles in the base to obtain a transistor with most of the properties of boron-base transistors preserved, but with some parameters improved because of the added indium. This "double-profile" or "indium-enhanced" transistor will exhibit improved beta-Early voltage product and lower temperature dependence of beta, but will otherwise preserve the advantageous properties of boron-base transistors.

For this to work satisfactory, the indium profile must however be contained within the boron profile in such a way that the beta and the effective base width are not dramatically affected, otherwise the low and high frequency properties will be degraded.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
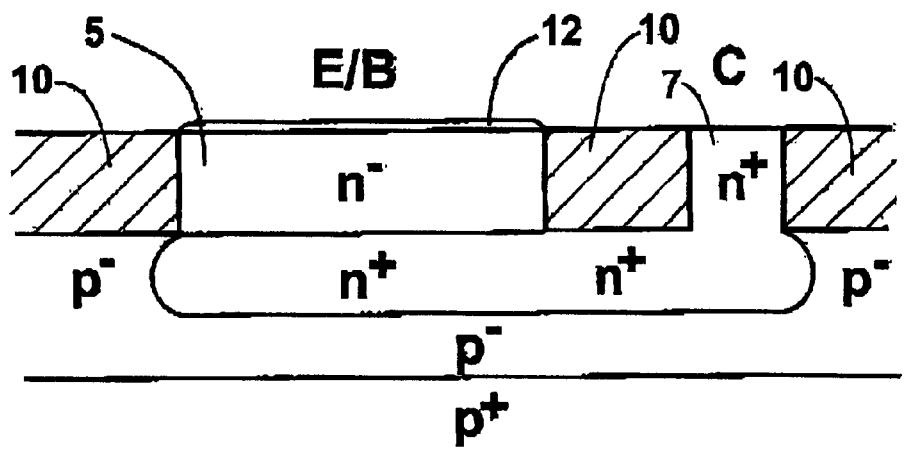
FIG. 1 schematically illustrates a substrate including device area and collector contact after creation of n-well and isolation.

The implementation described in U.S. Pat. No. 5,681,763 concerns a simple single-polysilicon bipolar transistor. In the present description, the implementation will show an advanced double-polysilicon transistor with inside spacers. In order to reduce unwanted side-effects, indium is only implanted exactly in the emitter opening, self-aligned using the inside spacers as blocker (a mask for other parts of the structure may be necessary), thus indium will only be placed at the exact part of the transistor where it is intended to, otherwise potentially degrading other transistors parameters.

Adding indium implantation into an existing high-frequency bipolar transistor flow is not complicated. A standard method for ion implant is extended with the necessary chemicals for implanting indium in conjunction with the common dpoants, B, BF2 and As, P and Sb.

The indium may be implanted in the same process step as when the base is ion-implanted or it may be preferred to perform a separate anneal step after indium implantation prior to boron implantation, to reduce enhanced boron diffusion. Indium can also be implanted later in the process flow at the same time as the SCI-implant is performed (used in advanced processes to locally increase the doping under the intrinsic base to reduce high current effects and increase the fT of the device).

The indium dose is selected to be quite low (same order as the boron implantation) but because of low ionization, the additional increase of active doping will be low and consequently the beta and the base resistance will essentially be the same as for boron-only transistors. The implantation energy is selected so that the finished indium profile will be present in the region determined by the boron profile, thus not extending the base width towards the collector region. To obtain an improved Early voltage, it must be placed so that dopants will be present in the collector-base depletion region, which is situated close to the collector-base junction, at reverse bias.

The Early voltage will be improved with the indium added, because indium acceptor states that fall within the collector-base depletion region will ionize and prevent the quasi-neutral base being depleted by the reverse-biased junction. In other words, the effective doping will be increased as a function of the reverse bias, thus compensating the depletion of the base and reducing the effect causing the Early voltage.

Consequently, presence of indium (within the boron profile) will also reduce susceptibility of punch-through of narrow base regions.

Furthermore, when temperature is increased, more indium will be ionized (less "freeze-out"), and the effective base doping will be increased. This will compensate the otherwise increased beta at higher temperature that a conventionally doped silicon transistor will experience.

Implementation

In FIGS. 1–10 a schematic process is indicated for a silicon npn-transistor using a high frequency bipolar RF-IC process with double-polysilicon and inside spacers.

(A). Fabrication sequence follows the process sequence up to and including formation of isolated device areas (nwell)+LOCOS or STI (shallow trench isolation) using conventional processing [4]. A resulting structure for a npn-device is shown in FIG. 1 with STI (the oxide 10, left and right), and the E/B-area 5 in the middle. The collector contact 7 is also indicated in FIG. 1. In the following figures, the formation of the E/B-area 5 and additional indium, In, implantation will be explained, leaving the details of the collector 7 contact formation, as being made in a conventional way.

On top of the E/B area 5, a thermal oxide 12, typically 100–300 Å, is present.

Figure 2:
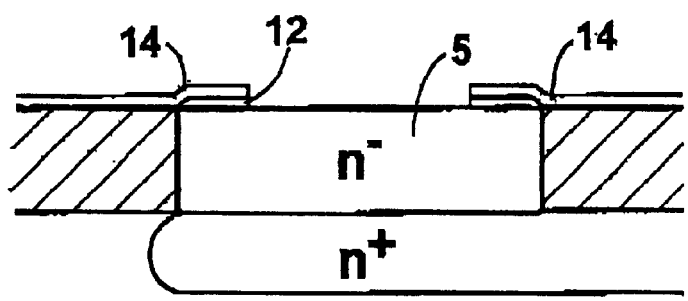
FIG. 2 schematically illustrates the substrate after deposition of nitride, utilization of E/B-mask, E/B-etch, removal of photoresist and oxide etch.

(B). Typically 100–300 Å of silicon nitride 14 is deposited on top of the oxide 12 by CVD. An E/B-opening mask (typically with a dimension of around 1 μm) is patterned using photo resist. The nitride is dry etched. Photo resist is removed. A resulting structure is illustrated in FIG. 2.

Figure 3:
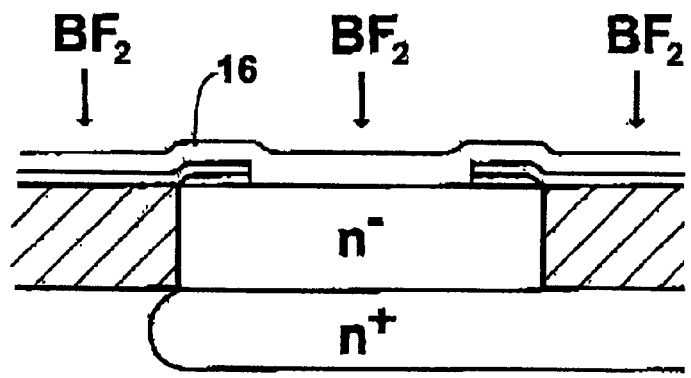
FIG. 3 illustrates deposition of base polysilicon layer and B or BF2 implant.
Figure 4:
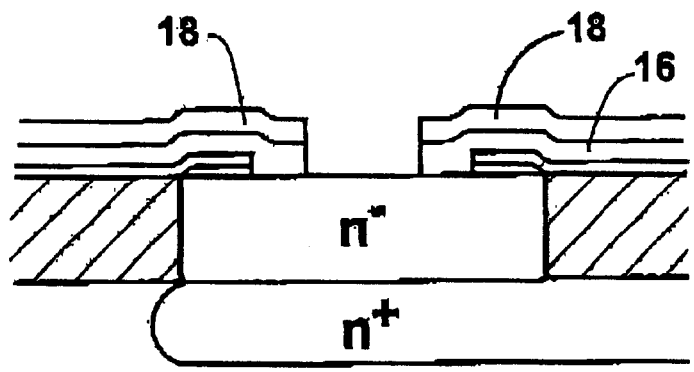
FIG. 4 illustrates the base polysilicon layer with TEOS applied and after etch using an emitter mask being then removed.

(C). Approximately 2000 Å polysilicon 16 for the extrinsic base contact is deposited. Extrinsic base is doped by implanting B or BF2 at low energy. This is illustrated in FIG. 3.

(D). On top of the polysilicon 16, 1000–2000 Å TEOS 18 (oxide) is deposited. The emitter opening is defined in a next masking step, and the TEOS 18 and polysilicon 16 is etched down to the silicon surface. The photoresist is removed. The result is demonstrated in FIG. 4.

Figure 5:
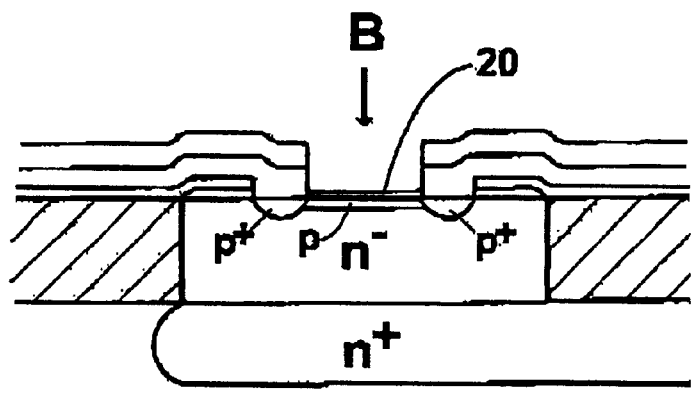
FIG. 5 illustrates applied base oxide and base implant by low dose of boron.

(E). A thin thermal base oxide 20 is grown in the opening prior to base implantation. As indicated in FIG. 5 a low dose, low energy boron implant sets the base doping.

Figure 6:
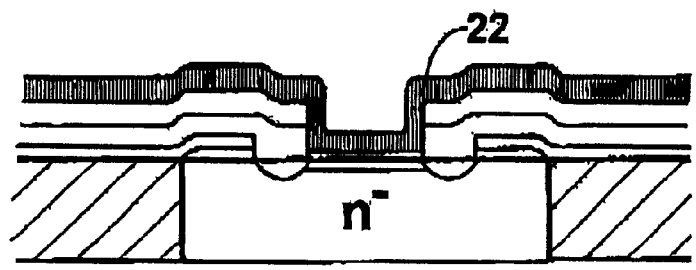
FIG. 6 illustrates the step of deposition of spacer nitride.

(F). To isolate the extrinsic base polysilicon from the emitter polysilicon and to further reduce the emitter opening, approximately 2000 Å of nitride 22 is conformally deposited as indicated in FIG. 6.

(G). The nitride 22 is etched anisotropically creating nitride spacers 24 at the inner side of the emitter opening ("inside spacers").

H. To locally increase the collector doping, an additional phosphorous implant (Secondary Collector Implant, SCI, or pedestal implant) is performed in the emitter opening. This implant is usually done after step D, but performing it after formation of inside spacers will put the phosphorous exactly where it is needed, i.e. under the emitter of the NPN-device.

Figure 7:
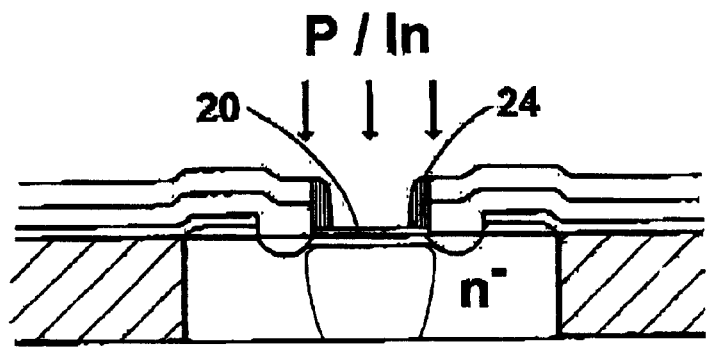
FIG. 7 illustrates created spacers after etching of spacer nitride layer and the step of implanting phosphorous (SCI) and indium.

At this stage, the indium will also be implanted. The dose and energy as well as the element itself are the subjects of the invention. FIG. 7 indicates the SCI process and the implant of indium. After the implant the oxide layer 20 is removed.

Figure 8:
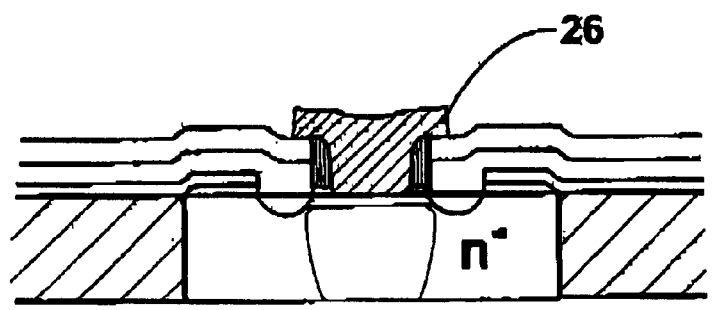
FIG. 8 illustrates substrate after removal of oxide and deposition of polysilicon, implant of arsenic, masking, etching and removal of mask.

(I). Next, the emitter polysilicon 26 will be deposited (typically 2000–3000 Å). Doping is done by implanting arsenic at high dose. One or several energies may be used. The emitter polysilicon is masked, dry etched and the photo resist is removed. FIG. 8 is a simplified illustration of this portion of the process.

Figure 9:
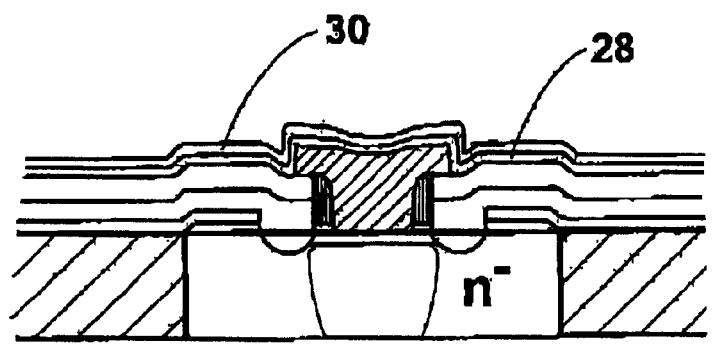
FIG. 9 illustrates the substrate provided with a thin oxide and nitride layer for an anneal using high temperature.

(J). To activate the dopants and set the doping profiles, the structure is annealed at high temperature for a short time. Typically, Rapid Thermal Anneal (RTA) is used at 24 1000° C. for 10–30 seconds. To prevent As to leave the polysilicon, thin oxide 28 and nitride 30 layers are deposited on top of the structure. These layers are removed after heat treatment. FIG. 9 shows the structure at the time of anneal.

Figure 10:
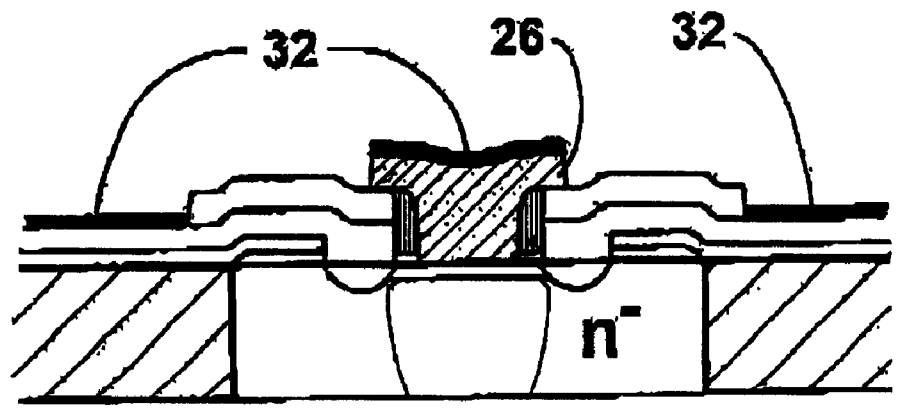
FIG. 10 illustrates substrate after a silicide formation step.
Figure 11:
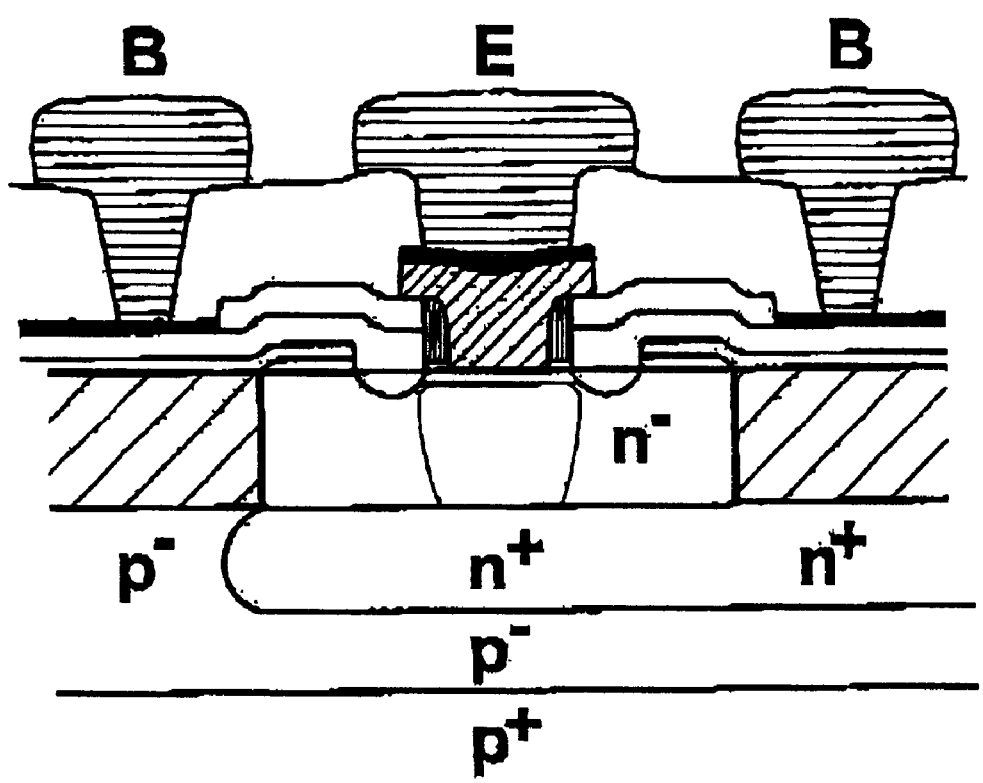
FIG. 11 illustrates a portion of the finished structure after metallization.

(K). A common step as illustrated in FIG. 10 is now to reduce the sheet resistivity of the polysilicon 26 by silicide formation 32. Part of the TEOS 18 on the extrinsic base polysilicon 16 is removed with an additional mask before the formation of the silicide.

(L). Metallization then follows (oxide deposition, contact hole, metal etc.). FIG. 10 illustrates the structure with the base and emitter contacts after the first metallization layer is completed.

Experimental results

To validate the subject of the invention, high-frequency bipolar transistors were fabricated as described above. The transistors were implanted with additional doses of $0.5$–$2.10^{13}$ cm$^{-2}$, 100 keV indium in connection to the SCI-step. The transistors had previously received a standard boron implant for the base. DC-check of the parameters at wafer level and comparison with a reference transistor without any indium in the base, revealed the set of parameters as illustrated in Table I below.

The data shows that all parameters except Early voltage (VA) are unchanged, including hFE. The hFE.VA product however has increased from 2840 to over 4600 for the highest dose. As a comparison, reported data from SiGe [5] shows hFE.VA-product of 70×60×4200.

TABLE I

Comparison of transistor parameters. Single NPN transistor with 0.6 × 3 μm emitter opening.

| Base Implant | No Indium | Indium $5 \cdot 10^{12}$ cm$^{-2}$ | Indium $1 \cdot 10^{13}$ cm$^{-2}$ | Indium $2 \cdot 10^{13}$ cm$^{-2}$ |
|---|---|---|---|---|
| $h_{FE} @I_E = 50 \mu A/\mu m^2$ | 79 | 72 | 75 | 76 |
| $V_A$ [V] | 36 | 45 | 54 | 61 |
| $h_{fe} \cdot V_A$ | 2840 | 3240 | 4050 | 4640 |
| $V_{ba}$ [V] @$I_E = 1$ mA/$\mu m^2$ | 0.79 | 0.79 | 0.79 | 0.79 |
| $V_{CE}$sat [V] | 0.111 | 0.112 | 0.111 | 0.114 |
| $BV_{CBO}$ [V] | 18 | 18 | 18 | 18 |
| $BV_{EBO}$ [V] | 3.7 | 3.8 | 3.7 | 3.6 |
| $R_E$ [Ω] | 17 | 18 | 17 | 19 |
| $R_C$ [Ω] | 53 | 54 | 53 | 55 |
| $I_{CBO}$ [A] | $1.4 \cdot 10^{-11}$ | $1.2 \cdot 10^{-11}$ | $1.3 \cdot 10^{-11}$ | $1.4 \cdot 10^{-11}$ |
| $I_{ebo}$ [A] | $3.7 \cdot 10^{-10}$ | $2.4 \cdot 10^{-10}$ | $4.4 \cdot 10^{-10}$ | $4.0 \cdot 10^{-10}$ |

TABLE II

Extracted SPICE CBC model parameters for indium-implanted and reference sample.

| Parameter | CJC [pF] | VJC [mV] | MJC |
|---|---|---|---|
| Indium implanted ($2 \cdot 10^{13}$ cm$^{-2}$) | 23.43 | 664.4 | 0.3 |
| Reference | 25.89 | 792.4 | 0.464 |

Figure 12:
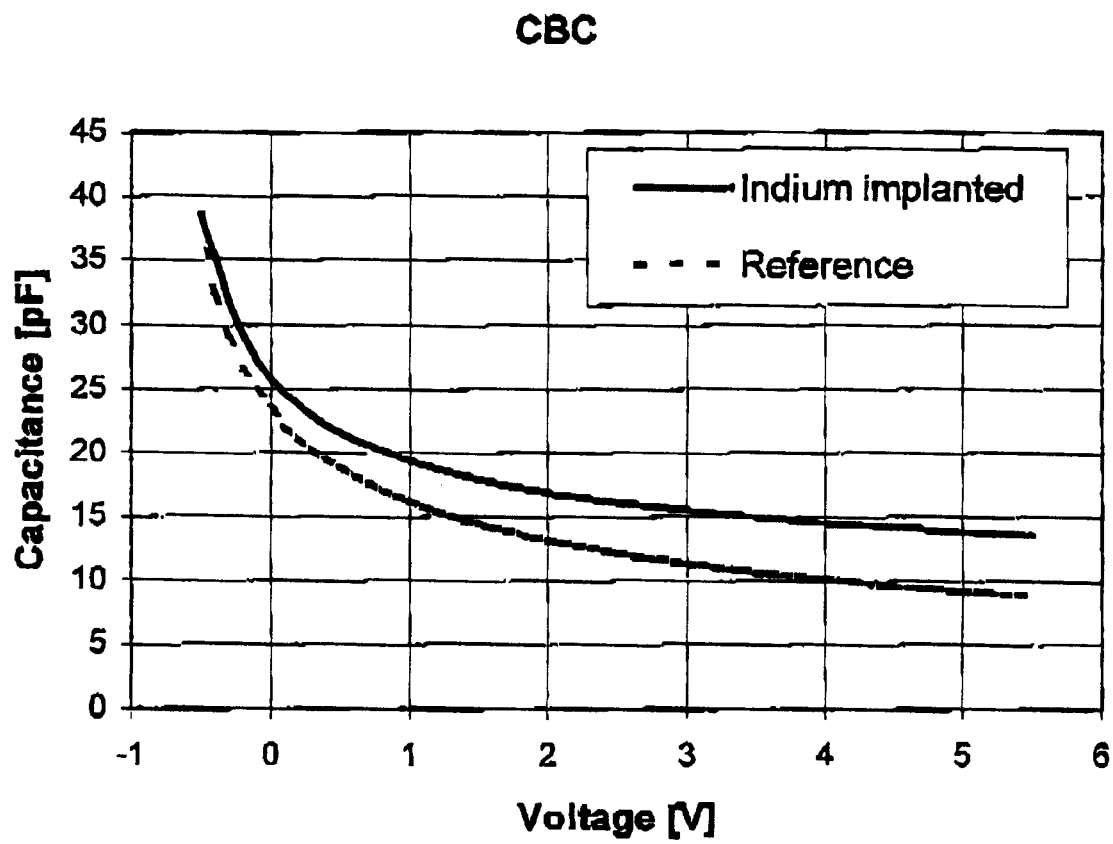
FIG. 12 illustrates the collector-base capacitance as a function of applied voltage.

The characteristics of the collector-base capacitance for a large emitter-area transistor is shown in FIG. 12 for the $2.10^{13}$ cm$^{-2}$ indium-implanted transistor and the reference transistor without any indium in the base. As expected, the capacitance at zero voltage bias is slightly higher for the indium-implanted transistor, while the capacitance-voltage swing (i.e. C(5 V)/C(0V)) is lower for the indium-implanted transistor. Extracted model parameters for the circuit simulator SPICE is shown in Table II. The decrease of MJC (grading coefficient) shows that the swing is lower for the indium implanted sample. This will results in better linearity in the high-frequency transfer characteristics.

To verify an expected improvement of temperature dependence of beta, the transistors were characterized at a temperature interval between 0° C. and 130° C. The extracted SPICE model parameters are listed in Table III. The temperature coefficient of beta (XTB) has been drastically reduced and the temperature coefficient for the saturation current (XTI) has decreased somewhat. Other parameters were not significantly influenced.

Therefore it can be concluded that the following advantages are obtained:

Improved beta-Early voltage product.

Improved linearity because of reduced collector-base capacitance swing.

Decreased temperature dependence of beta.

Preserved main electrical properties of boron-base bipolar transistors.

TABLE III

Extracted SPICE temperature model parameters for indium-implanted and reference sample.

| Parameter | XTI | XTB |
|---|---|---|
| Indium-implanted (2 · 10$^{13}$ cm$^{-2}$) | 4.500 | 270 m |
| Reference | 4.976 | 550 m |

It will be understood by those skilled in the art that various modifications and changes may be made to the present invention without departure from the scope thereof, which is defined by the appended claims.

What is claimed is:

1. A method for, in a silicon bipolar transistor, obtaining improved beta-Early voltage product and low temperature dependence, comprising the steps of:

combining boron and indium doping profiles to form a double-profile implanted in a base electrode of the silicon bipolar transistor, to thereby create the indium doping profile within the boron doping profile, said combination comprising a dose amount of indium selected to provide a non-intrinsic doping profile and to improve the beta-Early voltage product and the low temperature dependence of the transistor without substantially affecting a beta and an effective base width of the transistor, thereby maintaining desired values of beta and base resistance, as well as desirable high frequency properties of the transistor.

2. The method according to claim 1, comprising the further step of implanting the indium doping profile of the base electrode in a corresponding process step as when the base electrode is ion-implanted in a standard fabrication processing step.

3. The method according to claim 2, comprising the further step of performing a separate anneal process step after the indium profile implantation, but before performing implantation of the boron profile to reduce enhanced boron diffusion.

4. The method according to claim 1, comprising the further step of performing the indium profile implantation in the process flow at the same time as an SCI-implant being performed to locally increase doping level under an intrinsic base electrode to reduce high current effects and to increase high frequency parameter ft of the device.

5. The method according to claim 1, comprising the further step of performing the indium profile implantation after formation of inside spacers and thereby further limiting the implant opening, when implanting indium into the base region.

6. The method according to claim 1, comprising the further step of creating the silicon bipolar transistor as a double-polysilicon type of device.

7. The method according to claim 1, comprising the further step of positioning the indium doping overlapping the boron doping profile in the base electrode to stay within an existing boron profile of base electrode doping.

8. The method according to claim 7, comprising the further step of positioning the indium doping into a base-collector depletion region for facilitating a high frequency bipolar transistor.

9. The method according to claim 2, comprising the further step of positioning the indium doping overlapping the boron doping profile in the base electrode to stay within an existing boron profile of base electrode doping.

10. The method according to claim 9, comprising the further step of positioning the indium doping into a base-collector depletion region for facilitating a high frequency bipolar transistor.

11. The method according to claim 3, comprising the further step of positioning the indium doping overlapping the boron doping profile in the base electrode to stay within an existing boron profile of base electrode doping.

12. The method according to claim 11, comprising the further step of positioning the indium doping into a base-collector depletion region for facilitating a high frequency bipolar transistor.

13. The method according to claim 4, comprising the further step of positioning the indium doping overlapping the boron profile in the base electrode to stay within an existing boron profile of base electrode doping.

14. The method according to claim 13, comprising the further step of positioning the indium doping into a base-collector depletion region for facilitating a high frequency bipolar transistor.

15. The method according to claim 5, comprising the further step of positioning the indium doping overlapping the boron doping profile in the base electrode to stay within an existing boron profile of base electrode doping.

16. The method according to claim 15, comprising the further step of positioning the indium doping into a base-collector depletion region for facilitating a high frequency bipolar transistor.

17. The method of claim 1, wherein the dose amount of indium is selected to improve voltage dependence of a junction depletion capacitance in the transistor.

18. The method of claim 1, wherein the dose amount of indium is selected to improve both voltage dependence of a junction depletion capacitance and linearity in the transistor.

* * * * *